US011049782B2

(12) United States Patent
Lee et al.

(10) Patent No.: US 11,049,782 B2
(45) Date of Patent: Jun. 29, 2021

(54) FAN-OUT SEMICONDUCTOR PACKAGE

(71) Applicant: SAMSUNG ELECTRONICS CO., LTD., Suwon-si (KR)

(72) Inventors: Hanul Lee, Suwon-si (KR); Younggwan Ko, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/675,805

(22) Filed: Nov. 6, 2019

(65) Prior Publication Data

US 2020/0161202 A1    May 21, 2020

(30) Foreign Application Priority Data

Nov. 20, 2018   (KR) .......................... 10-2018-0143304

(51) Int. Cl.
| | |
|---|---|
| *H01L 23/31* | (2006.01) |
| *H01L 23/13* | (2006.01) |
| *H01L 23/498* | (2006.01) |
| *H01L 23/00* | (2006.01) |
| *H01L 23/14* | (2006.01) |

(52) U.S. Cl.
CPC .......... *H01L 23/3121* (2013.01); *H01L 23/13* (2013.01); *H01L 23/14* (2013.01); *H01L 23/49822* (2013.01); *H01L 23/49827* (2013.01); *H01L 24/32* (2013.01); *H01L 2224/32245* (2013.01)

(58) Field of Classification Search
None
See application file for complete search history.

(56) References Cited

U.S. PATENT DOCUMENTS

| | | | |
|---|---|---|---|
| 8,013,434 B2 | 9/2011 | Lin et al. | |
| 10,453,788 B2* | 10/2019 | Lee | .......................... H01L 23/13 |
| 2003/0116843 A1* | 6/2003 | Iijima | .................... H05K 1/187 |
| | | | 257/700 |
| 2007/0095471 A1* | 5/2007 | Ito | ........................ H01L 23/5389 |
| | | | 156/293 |
| 2019/0333846 A1* | 10/2019 | Wang | ...................... H01L 24/19 |
| 2020/0111732 A1* | 4/2020 | Kanbe | ................. H01L 21/4846 |

FOREIGN PATENT DOCUMENTS

KR           10-1901712 B1    9/2018

* cited by examiner

*Primary Examiner* — J. E. Schoenholtz
(74) *Attorney, Agent, or Firm* — Sughrue Mion, PLLC

(57) ABSTRACT

A fan-out semiconductor package includes a frame including a plurality of wiring layers electrically connected to each other and having a recess portion having a bottom surface on which a stopper layer is disposed, a semiconductor chip having an active surface on which a connection pad is disposed and an inactive surface opposing the active surface, the inactive surface being disposed in the recess portion to face the stopper layer, an encapsulant covering at least a portion of the frame and at least a portion of the semiconductor chip, the encapsulant being disposed in at least a portion of the recess portion, and a connection structure disposed on the frame and the active surface and including a redistribution layer electrically connected to the plurality of wiring layers and the connection pad. A thickness of the stopper layer is greater than a thickness of each of the plurality of wiring layers.

15 Claims, 11 Drawing Sheets

I-I'

FAN-OUT SEMICONDUCTOR PACKAGE

CROSS-REFERENCE TO RELATED APPLICATION(S)

This application claims the benefit of priority to Korean Patent Application No. 10-2018-0143304 filed on Nov. 20, 2018 in the Korean Intellectual Property Office, the entire disclosure of which is incorporated herein by reference.

TECHNICAL FIELD

The present disclosure relates to a semiconductor package, and more particularly, to a fan-out semiconductor package in which an electrical connection metal may be extended in addition to an area in which a semiconductor chip is disposed.

BACKGROUND

A major trend in the development of technology related to semiconductor chips is to reduce the size of components. Therefore, in the package field, it is required to implement a large number of fins with miniaturization in response to a surge in demand for miniaturized semiconductor chips and the like. The semiconductor package technology proposed to meet this requirement is a fan-out semiconductor package. In the case of the fan-out semiconductor package, an electrical connection metal may be redistributed in addition to a region in which a semiconductor chip is disposed, thereby implementing a large number of fins while implementing miniaturization.

On the other hand, the need for a fan-out semiconductor package having a redistribution layer on the backside as well as the front side due to an increase in the number of I/Os in package products and application of package on package (POP) is continuously increasing. In this regard, an existing method has been used, in which a redistribution layer on the backside is sequentially added after a front side redistribution layer forming process is completed. However, in this case there is present a problem such as an increase in defects, an increase in investment costs, and an increase in process costs due to backside process progress.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

According to an aspect of the present disclosure, a fan-out semiconductor package may make it possible to easily apply a wiring layer to a backside, and to improve productivity and quality in a corresponding process for a blind recess portion of a frame without affecting an entire thickness of a package or warpage.

According to an aspect of the present disclosure, a frame having a blind recess portion is introduced, and a thickness of a stopper layer disposed on a bottom surface of the recess portion is relatively increased, regardless of a thickness of a wiring layer of the frame.

According to an aspect of the present disclosure, a fan-out semiconductor package includes a frame including a plurality of wiring layers electrically connected to each other and having a recess portion having a bottom surface on which a stopper layer is disposed; a semiconductor chip having an active surface on which a connection pad is disposed and an inactive surface opposing the active surface, the inactive surface being disposed in the recess portion to face the stopper layer; an encapsulant covering at least a portion of the frame and at least a portion of the semiconductor chip, the encapsulant being disposed in at least a portion of the recess portion; and a connection structure disposed on the frame and the active surface of the semiconductor chip, and including a redistribution layer electrically connected to the plurality of wiring layers and the connection pad. A thickness of the stopper layer is greater than a thickness of each of the plurality of wiring layers.

According to another aspect of the present disclosure, a fan-out semiconductor package includes a frame including a first insulating layer, a first wiring layer disposed on a lower surface of the first insulating layer, a second wiring layer disposed on an upper surface of the first insulating layer, a second insulating layer disposed on the lower surface of the first insulating layer to cover the first wiring layer, a third insulating layer disposed on the upper surface of the first insulating layer to cover the second wiring layer, a third wiring layer disposed on a lower surface of the second insulating layer, and a fourth wiring layer disposed on an upper surface of the third insulating layer, the first to fourth wiring layers being electrically connected to each other, the frame having a recess portion having a bottom surface on which a stopper layer is disposed; a semiconductor chip having an active surface on which a connection pad is disposed and an inactive surface opposing the active surface, the inactive surface being disposed in the recess portion to face the stopper layer; an encapsulant covering at least a portion of the frame and at least a portion of the semiconductor chip, the encapsulant being disposed in at least a portion of the recess portion; and a connection structure disposed on the frame and the active surface of the semiconductor chip, and including a redistribution layer electrically connected to the first to fourth wiring layers and the connection pad. The stopper layer includes a first metal layer embedded in the second insulating layer and exposed to an upper surface of the second insulating layer, and a second metal layer of which an edge is embedded in the first insulating layer, the second metal layer covering a portion of the first metal layer exposed to the upper surface of the second insulating layer.

According to still another aspect of the present disclosure, a fan-out semiconductor package includes a frame including a plurality of insulating layers and a plurality of wiring layers respectively disposed on each of the plurality of insulating layers and electrically connected to each other, the frame having a recess portion having a bottom surface on which a stopper layer is disposed; a semiconductor chip having an active surface on which a connection pad is disposed and an inactive surface opposing the active surface, the inactive surface being disposed in the recess portion to face the stopper layer; an encapsulant covering at least a portion of the frame and at least a portion of the semiconductor chip, the encapsulant being disposed in at least a portion of the recess portion; and a connection structure disposed on the frame and the active surface of the semiconductor chip, and including a redistribution layer electrically connected to the plurality of wiring layers and the connection pad. The stopper layer includes a first portion embedded in the plurality of insulating layers, and a remaining portion of the stopper layer is arranged outside the plurality of insulating layers.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Figure 1:
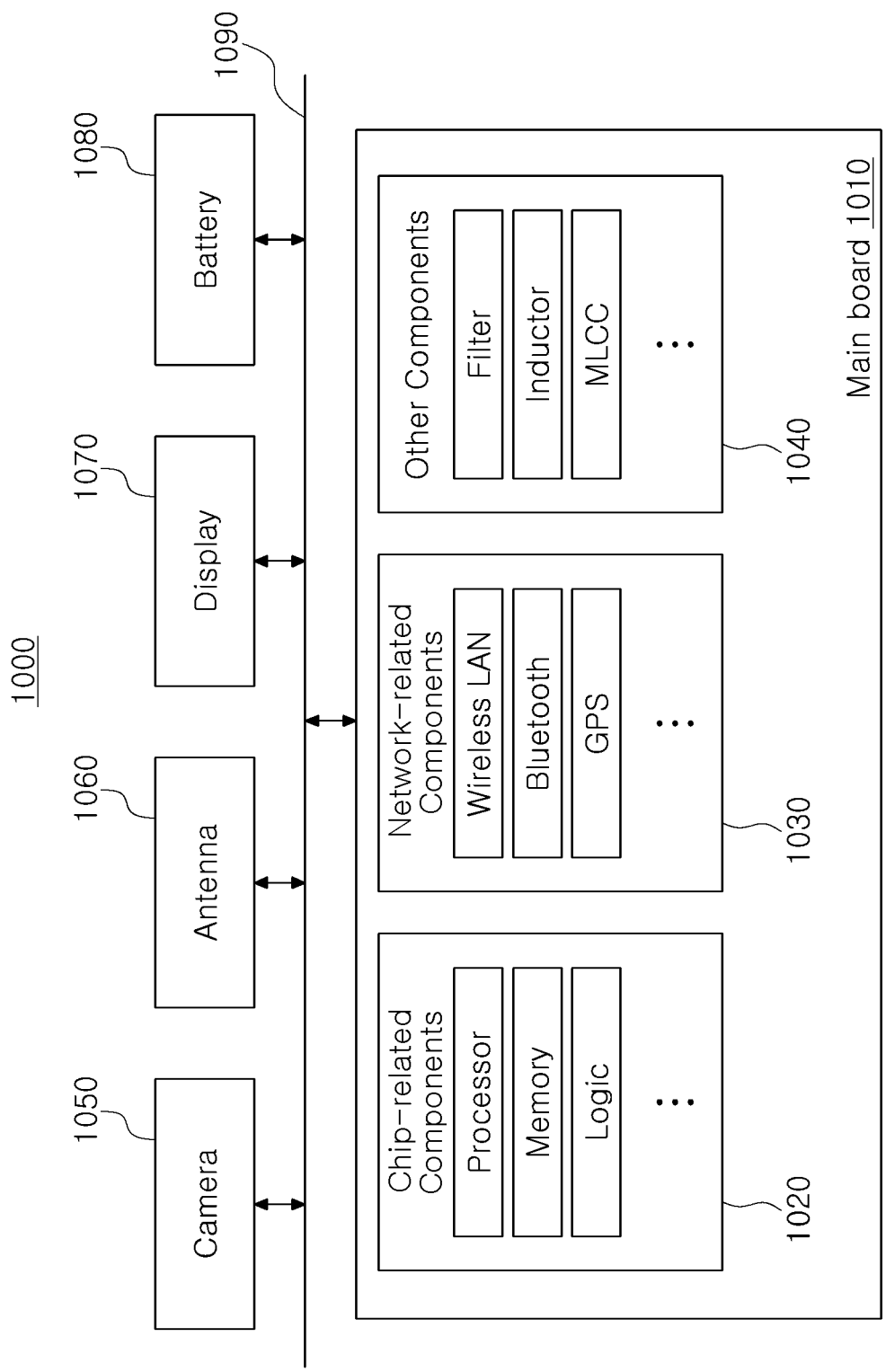
FIG. 1 is a schematic block diagram illustrating an example of an electronic device system.

Hereinafter, examples of the present disclosure will be described with reference to the accompanying drawings. The shape and size of constituent elements in the drawings may be exaggerated or reduced for clarity.

Electronic Device

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
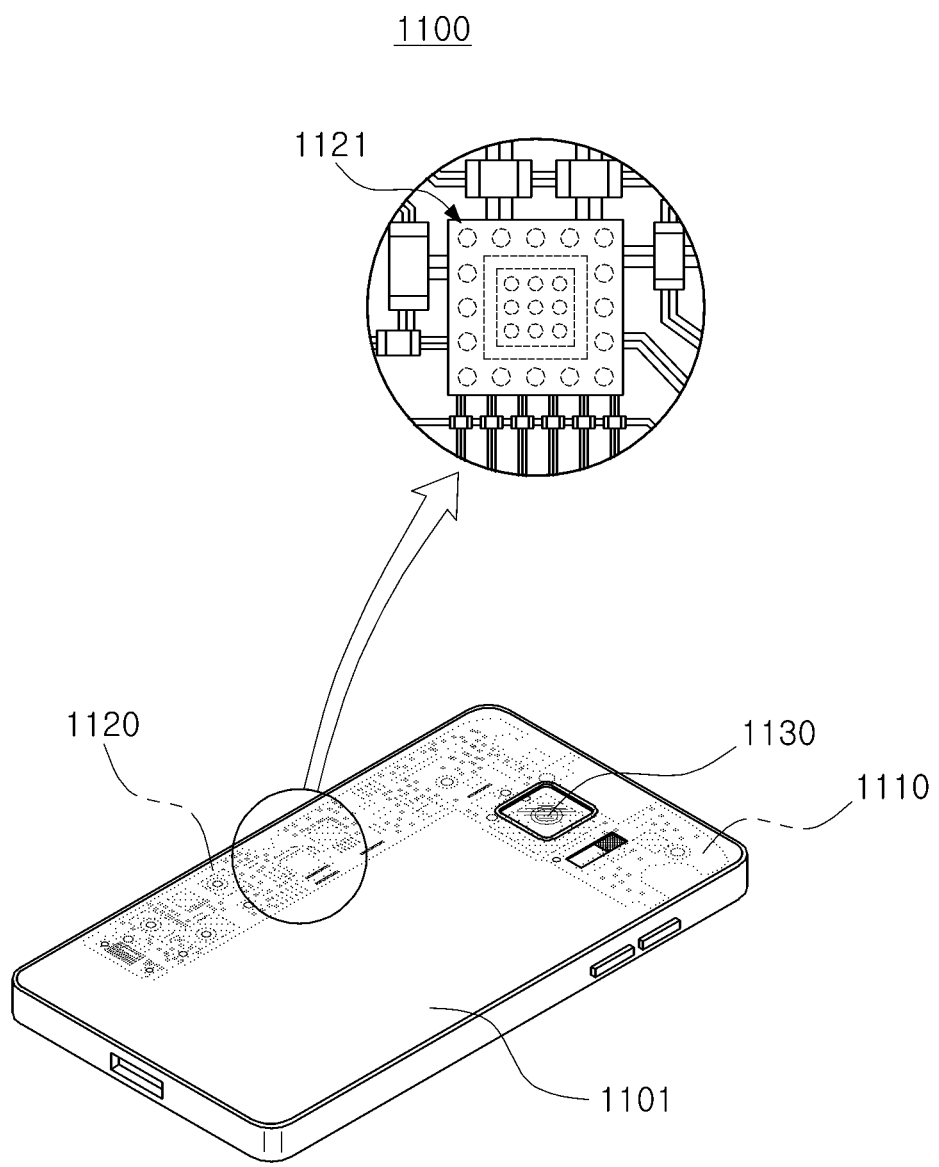
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the motherboard 1110, such as a camera module 1130, may be accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

In this case, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3A:
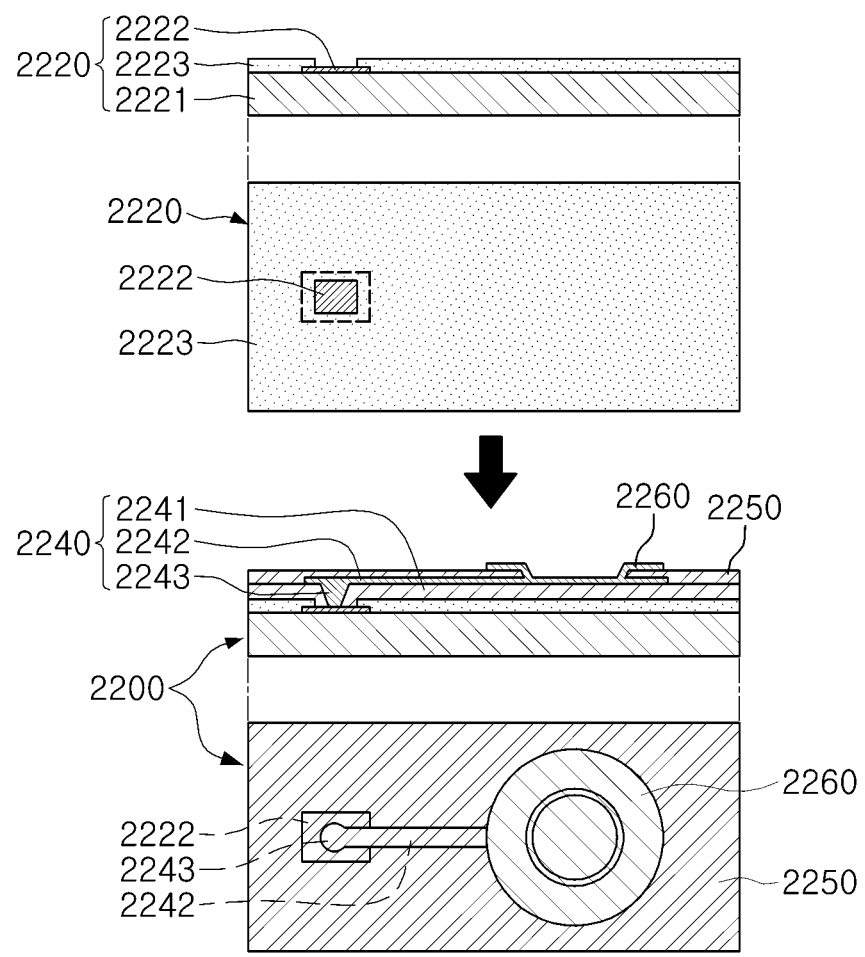
FIGS. 3A and 3B are schematic cross-sectional views illustrating states of a fan-in semiconductor package before and after being packaged.
Figure 3B:
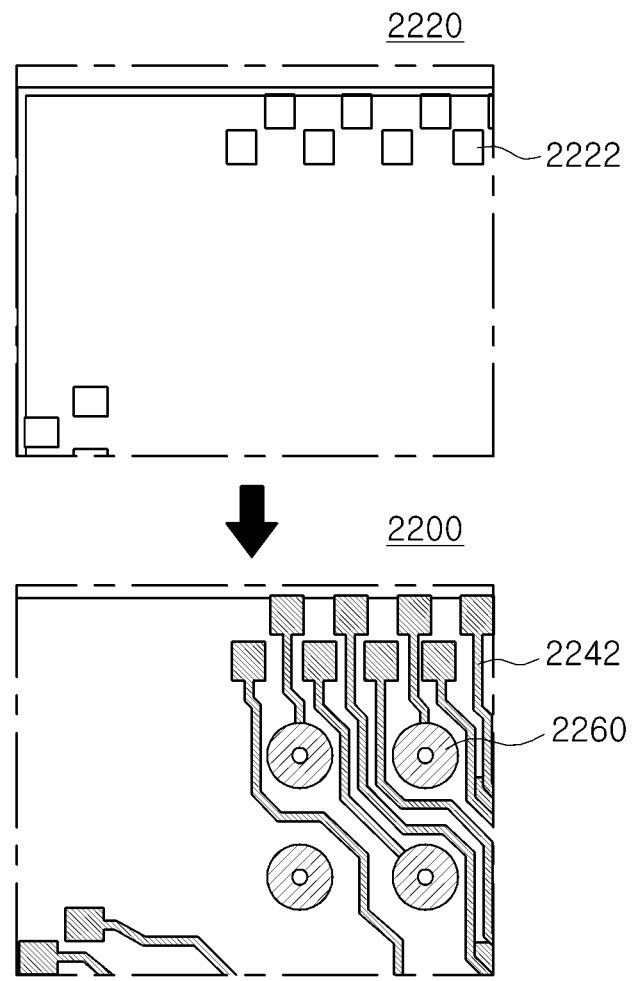

FIGS. 3A and 3B are schematic cross-sectional views illustrating states of a fan-in semiconductor package before and after being packaged.

Figure 4:
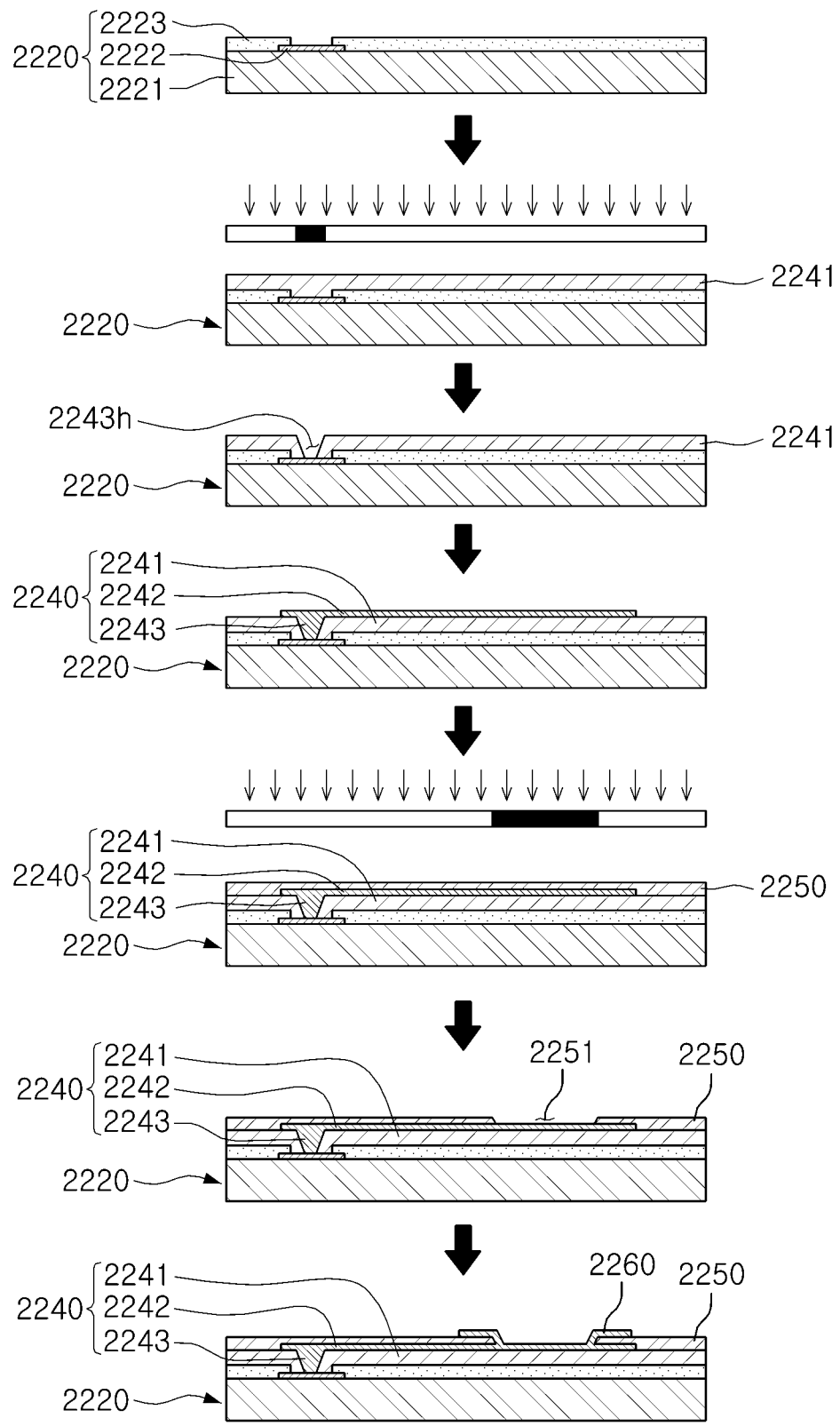
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 to redistribute the connection pads 2222. The connection member 2240 may be formed by forming an insulating layer 2241 on the semiconductor chip 2220 using an insulating material such as a photoimageable dielectric (PID) resin, forming via holes 2243*h* opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. For example, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even though a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip are not enough to directly mount the fan-in semiconductor package on the mainboard of the electronic device.

Figure 5:
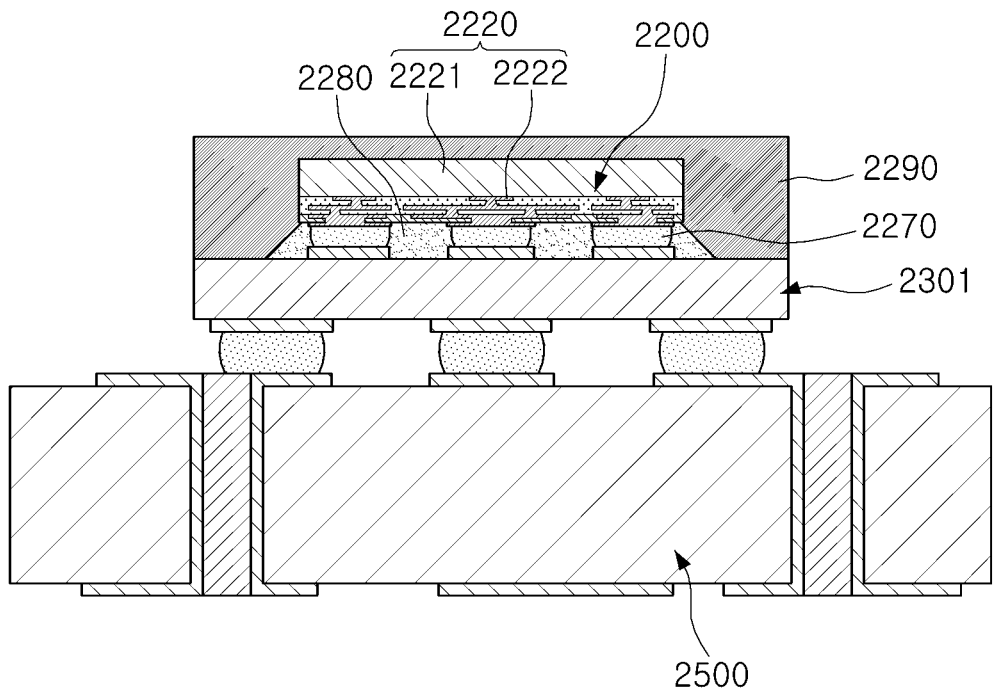
FIG. 5 is a schematic cross-sectional view illustrating a case in which a fan-in semiconductor package is mounted on a printed circuit board and is ultimately mounted on a mainboard of an electronic device.

FIG. 5 is a schematic cross-sectional view illustrating a case in which a fan-in semiconductor package is mounted on a printed circuit board (PCB) substrate and is ultimately mounted on a mainboard of an electronic device.

Figure 6:
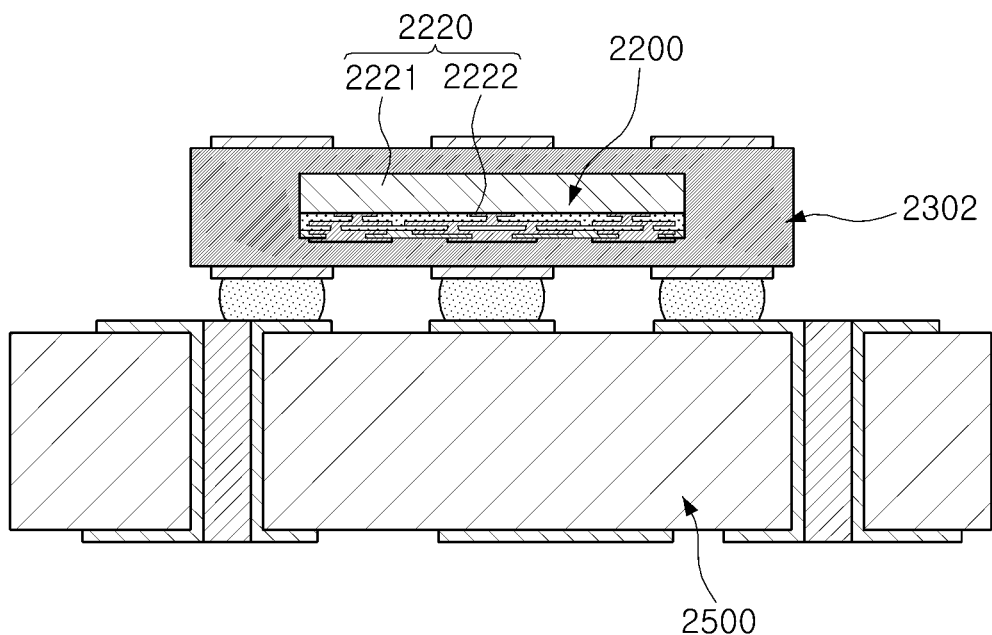
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board (PCB) and is ultimately mounted on a mainboard of an electronic device.

Referring to FIGS. 5 and 6, in a fan-in semiconductor package 2200, connection pads 2222, For example, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the PCB 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate PCB 2302, connection pads 2222, For example, I/O terminals, of the semiconductor chip 2220 may be redistributed by the PCB 2302 in a state in which the fan-in semiconductor package 2200 is embedded in the PCB 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate PCB and be then mounted on the mainboard of the electronic device through a packaging process or may be mounted and used on the mainboard of the electronic device in a state in which it is embedded in the PCB.

Fan-Out Semiconductor Package

Figure 7:
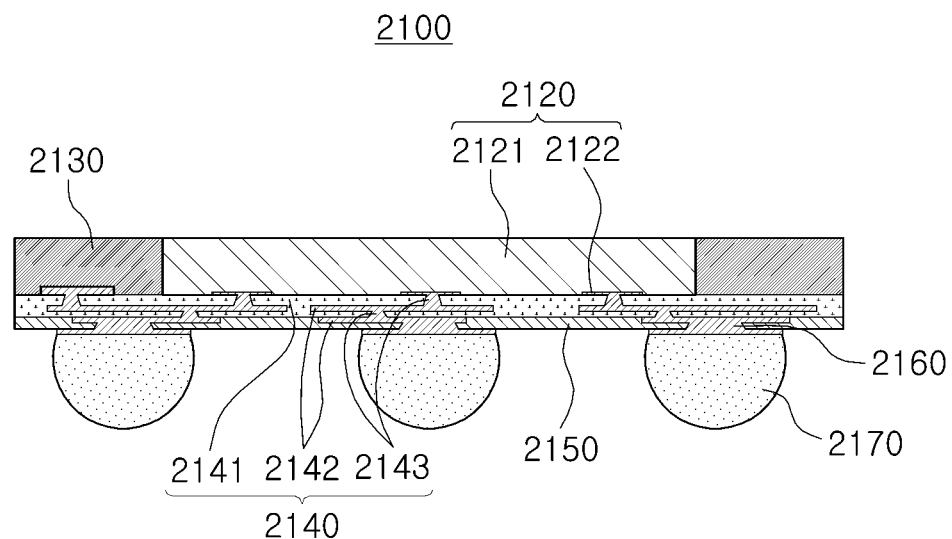
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate PCB, as described below.

Figure 8:
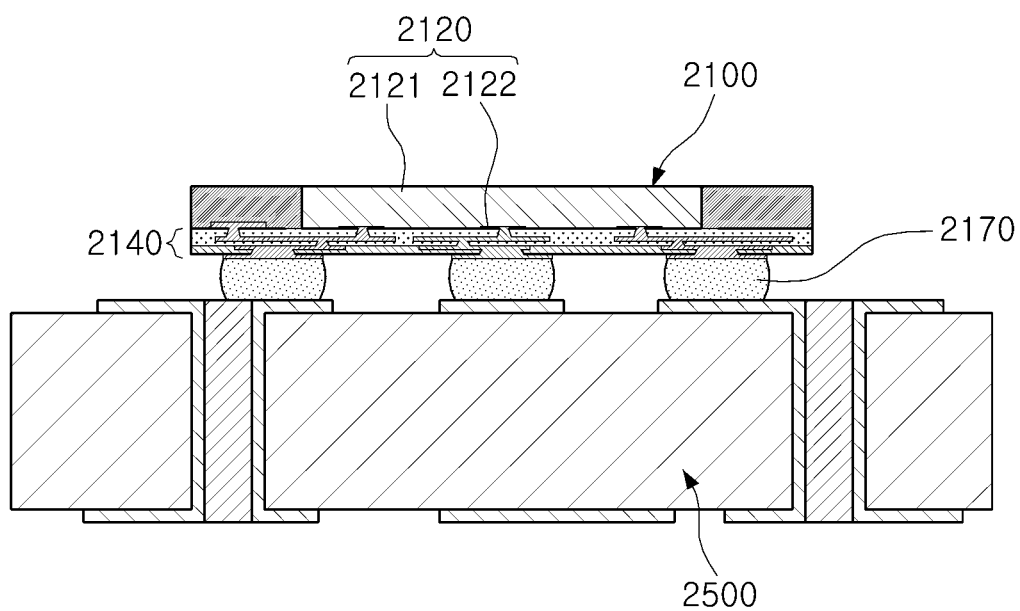
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. For example, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate PCB, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a PCB, or the like, having a scale, a purpose, and the like, different from those of the fan-out semiconductor package, and having the fan-in semiconductor package embedded therein.

Hereinafter, a fan-out semiconductor package, which makes it possible to easily apply a wiring layer to a backside and to improve productivity and quality during a manufacturing process of a blind recess portion of a frame without affecting an entire thickness of a package or warpage, will be described with reference to the drawings.

Figure 9:
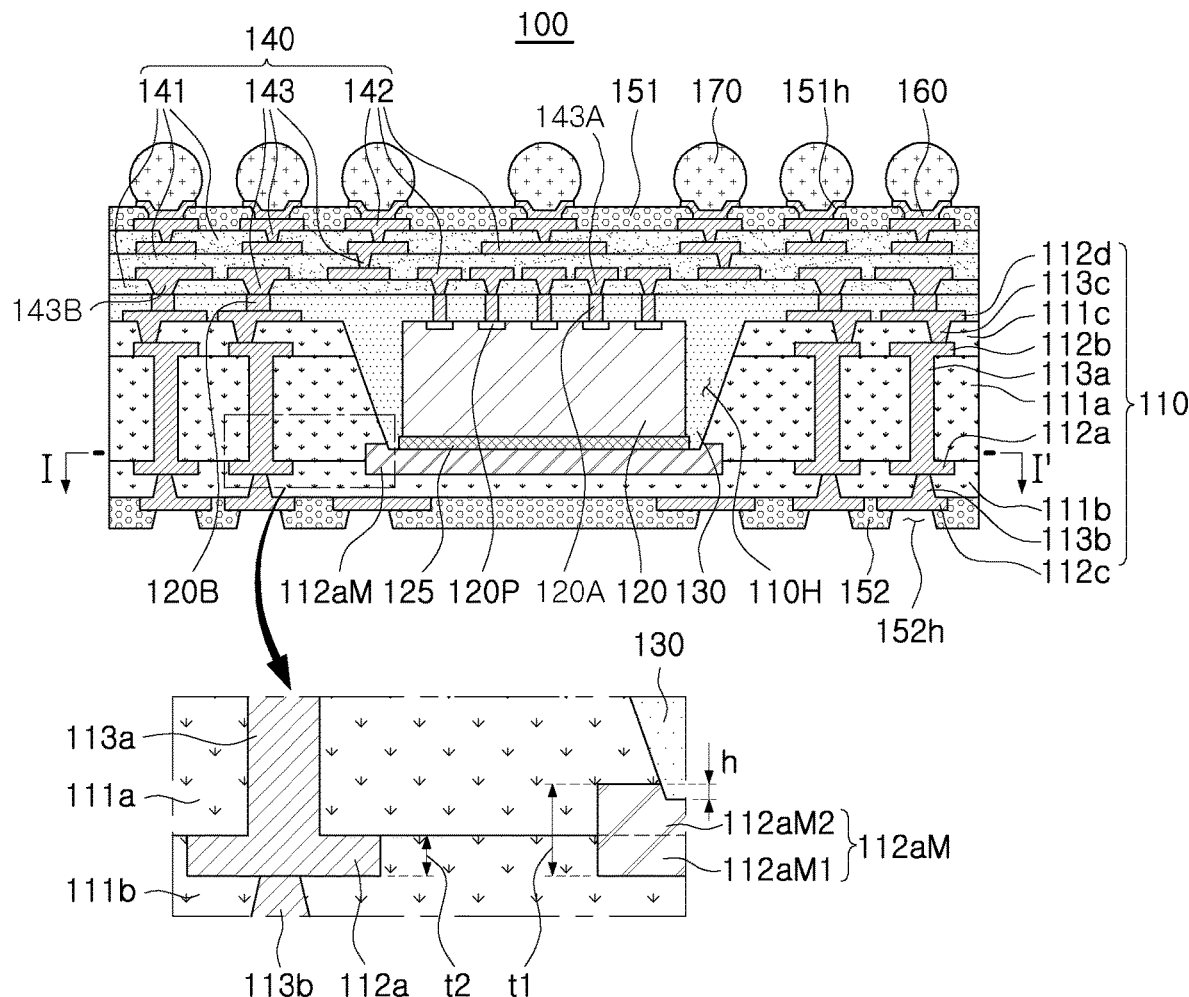
FIG. 9 is a cross-sectional view schematically illustrating an example of a fan-out semiconductor package.

FIG. 9 is a cross-sectional view schematically illustrating an example of a fan-out semiconductor package.

Figure 10:
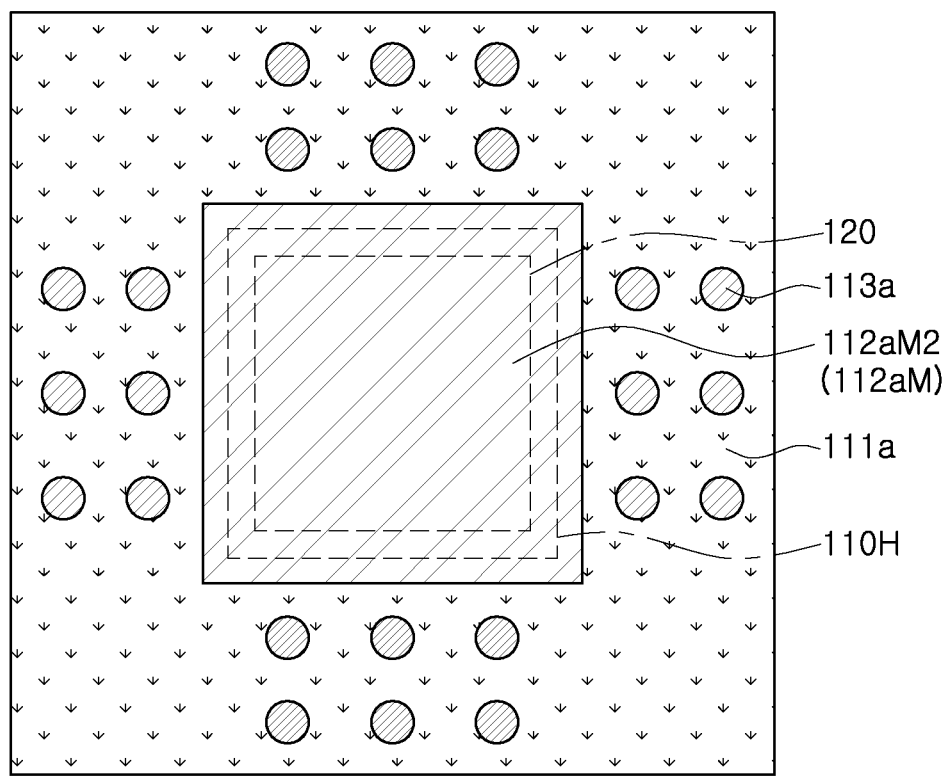
FIG. 10 is a schematic cross-sectional plan view of the fan-out semiconductor package, taken along line I-I' of FIG. 9.

FIG. 10 is a schematic cross-sectional plan view of the fan-out semiconductor package, taken along line I-I' of FIG. 9.

Referring to FIGS. 9 and 10, a fan-out semiconductor package 100 according to an example includes a frame 110 including a plurality of wiring layers 112a, 112b, 112c and 112d electrically connected to each other and having a recess portion 110H in which a stopper layer 112aM is disposed on a bottom surface thereof, a semiconductor chip 120 having an active surface on which a connection pad 120P is disposed and an inactive surface opposing the active surface, the inactive surface being disposed in the recess portion 110H to face the stopper layer 112aA, an encapsulant 130 covering at least a portion of each of the frame 110 and the semiconductor chip 120 and filling at least a portion of the recess portion 110H, and a connection structure 140 disposed on the frame 110 and the active surface of the semiconductor chip 120, and including a redistribution layer 142 electrically connected to the plurality of wiring layers 112a, 112b, 112c and 112d and the connection pad 120P. In this case, a thickness t1 of the stopper layer 112aM is greater than a thickness t2 of each of the wiring layers 112a, 112b, 112c and 112d. Herein, regarding 'thickness', in the case in which the thickness is not constant, it means the thickness in a relatively thickest region.

On the other hand, as described above, the need for a fan-out semiconductor package having a redistribution layer on the back side as well as the front side due to an increase in the number of I/Os of package products and application of Package on Package (POP) is continuously increasing. In this regard, a method in which a redistribution layer on the back side is sequentially added after a process of forming a redistribution layer on the front side is completed has been used. However, in this case there is present a problem such as an increase in defects, an increase in investment costs, and an increase in process costs due to backside process progress.

Meanwhile, in the case of the fan-out semiconductor package 100 according to an example in the present disclosure, the frame 110 including the plurality of wiring layers 112a, 112b, 112c and 112d is first formed before embedding the semiconductor chip 120, and then, a recess portion 110H of a blind shape is formed using the stopper layer 112aM, and then, the semiconductor chip 120 is disposed and embedded in the recess portion 110H. Therefore, at least one wiring layer, for example, a third wiring layer 112c, may be introduced at a lower level than the stopper layer 112aM, based on the inactive surface of the semiconductor chip 120, before the placement of the semiconductor chip 120. For example, since the backside wiring layer 112c may be formed when forming the frame 110, occurrence of problems such as an increase in defects, an increase in investment costs, and an increase in process costs due to the progress of a redistribution layer formation process on the backside may be reduced.

On the other hand, to control warpage of a package product and reduce an overall thickness of the package, a design to appropriately control or significantly reduce thicknesses of the wiring layers 112a, 112b, 112c and 112d of the respective frame 110 is required. In this case, generally, the stopper layer 112aM is formed together when the plurality of wiring layers 112a, 112b, 112c and 112d of the frame 110 are formed. Thus, in this case, if the stopper layer 112aM is merely formed at the same level and at the same thickness as at least one wiring layer 112a, the thickness of the stopper layer 112aM is reduced as the thickness of the wiring layer 112a becomes thin. As a result, the stopper layer 112aM may not be able to carry out a function for formation of the recess portion 110H properly. For example, the stopper layer 112aM may be penetrated or lifted during a process such as sand blasting, laser processing, and plasma processing for formation of the recess portion 110H.

Meanwhile, in the fan-out semiconductor package 100 according to an example of the present disclosure, the thickness t1 of the stopper layer 112aM may be increased, regardless of the thickness t2 of the wiring layers 112a, 112b, 112c and 112d. For example, the thickness t1 of the stopper layer 112aM may be freely adjusted while the thickness t2 of the wiring layers 112a, 112b, 112c and 112d is fixed to a designed value. Therefore, by reducing the thickness t2 of the wiring layers 112a, 112b, 112c and 112d relatively small to reduce a total thickness of the frame 110, the thickness of the fan-out semiconductor package 100 may be reduced as a result, warpage may be controlled, and simultaneously, productivity and quality in a process for the blind recess portion 110H may be improved by relatively increasing the thickness t1 of the stopper layer 112aM.

Hereinafter, respective constitutions included in the fan-out semiconductor package 100 according to an example will be described in more detail.

The frame 110 may further improve the rigidity of the fan-out semiconductor package 100 according to a detailed material of insulating layers 111a, 111b and 111c, and may serve to ensure thickness uniformity of the encapsulant 130. In addition, the frame 110 includes the wiring layers 112a, 112b, 112c and 112d and wiring via layers 113a, 113b and 113c, and thus, may serve as an electrical connection structure for vertical electrical connection, and a problem relevant to a yield of the semiconductor chip 120 due to defects that may occur in the process of forming the connection structure 140 may be reduced. Since the frame 110 includes the third wiring layer 112c disposed to be lower than the stopper layer 112aM with respect to the inactive surface of the semiconductor chip 120, a backside wiring layer for the semiconductor chip 120 may be provided without a separate backside wiring process.

The frame 110 may have a blind-type recess portion 110H formed by using the stopper layer 112aM as a stopper, and the semiconductor chip 120 may be attached to the stopper layer 112aM in such a manner that the inactive surface is attached thereto via a known adhesive member 125 such as a die attach film (DAF), or the like. The recess portion 110H may be formed through a sand blast process or the like, and in this case, a cross-sectional shape thereof may be a tapered shape. For example, a sidewall of the recess portion 110H may have a predetermined slope, for example, an inclination, with respect to the stopper layer 112aM. In this case, since an aligning process of the semiconductor chip 120 may be further facilitated, the yield may be increased.

The frame 110 includes a first insulating layer 111a, first and second wiring layers 112a and 112b disposed on both surfaces of the first insulating layer 111a, respectively, first and third insulating layers 111b and 111c which are disposed on both surfaces of the first insulating layer 111a to cover the first and second wiring layers 112a and 112b, respectively, a third wiring layer 112c disposed on a lower surface of the second insulating layer 111b, and a fourth wiring layer 112d disposed on an upper surface of the third insulating layer 111c. Further, the frame 110 includes a first wiring via layer 113a penetrating through the first insulating layer 111a and electrically connecting the first and second wiring layers 112a and 112b, a second wiring via layer 113b penetrating through the second insulating layer 111b and electrically connecting the first and third wiring layers 112a and 112c, and a third wiring via layer 113c penetrating through the third insulating layer 111c and electrically connecting the second and fourth wiring layers 112b and 112d.

The first to fourth wiring layers 112a, 112b, 112c and 112d of the frame 110 are electrically connected to each other, and electrically connected to the connection pads 120P of the semiconductor chip 120, respectively. The recess portion 110H may penetrate through the first insulating layer 111a and the third insulating layer 111c but may not penetrate through the second insulating layer 111b. The second insulating layer 111b and the third insulating layer 111c, and the wiring layers 112c and 112d and the wiring via layers 113b and 113c, formed thereon, may be configured in a relatively larger number. The second insulating layer 111b and the third insulating layer 111c, and the wiring layers 112c and 112d and the wiring via layers 113b and 113c, formed thereon, are disposed to be substantially symmetrical with respect to the first insulating layer 111a.

As the material of the insulating layers 111a, 111b and 111c, an insulating material may be used. As the insulating material, a thermosetting resin such as an epoxy resin, a thermoplastic resin such as polyimide, or a resin mixture provided by mixing such resins with an inorganic filler or a resin formed by impregnating these resins in a core material such as a glass fiber, a glass cloth, a glass fabric, or the like, together with an inorganic filler, for example, a prepreg resin, Ajinomoto Bulid-up Film (ABF) resin, FR-4 resin, Bismaleimide Triazine (BT) resin, or the like, may be used. In the case in which a rigid material such as a prepreg including glass fiber or the like is used, the frame 110 may be utilized as a support member for controlling warpage of the fan-out semiconductor package 100.

The first insulating layer 111a may have a thickness greater than that of each of the first and third insulating layers 111b and 111c. The first insulating layer 111a may have a relatively great thickness to maintain basic rigidity, and the first insulating layer 111b and the third insulating layer 111c may be employed to form a relatively large number of wiring layers 112c and 112d. The first insulating layer 111a may be introduced through a relatively thick copper-clad laminate (CCL), and the second insulating layer 111b and the third insulating layer 111c may be introduced through relatively thin prepreg or ABF, but an example thereof is not limited thereto. Similarly, the first wiring via layer 113a penetrating through the first insulating layer 111a may have an average diameter greater than that of the second and third wiring via layers 113b and 113c passing through the first and third insulating layers 111b and 111c.

The wiring layers 112a, 112b, 112c and 112d may redistribute the connection pads 120P of the semiconductor chip 120 together with the redistribution layer 142, and in addition, may provide a vertical electrical connection path of the fan-out semiconductor package 100. As a material for formation of the respective wiring layers 112a, 112b, 112c and 112d, a metal material such as copper (Cu), aluminum (Al), silver (Ag), tin (Sn), gold (Au), nickel (Ni), lead (Pb), titanium (Ti), or alloys thereof may be used. The wiring layers 112a, 112b, 112c and 112d may perform various functions according to the design of a relevant layer. For example, the wiring layers 112a, 112b, 112c and 112d may include a ground (GrouND: GND) pattern, a power (PoWeR: PWR) pattern, a signal (Signal: S) pattern, and the like. The ground (GND) pattern and the power (PWR) pattern may be formed in the same pattern, but an example thereof is not limited thereto. The signal S pattern includes various signals except the ground (GND) pattern, the power (PWR) pattern and the like, for example, may include a data signal and the like, and in addition, may include various pad patterns.

The thickness of each of the wiring layers 112a, 112b, 112c and 112d may be greater than the thickness of each of the redistribution layers 142 of the connection structure 140. The frame 110 may have a thickness equal to or greater than that of the semiconductor chip 120, and thus, the wiring layers 112a, 112b, 112c and 112d may also be formed in a relatively larger size. On the other hand, the redistribution layer 142 of the connection structure 140 may be formed in a relatively small size for fine design and thinning.

The wiring via layers 113a, 113b and 113c electrically connect the wiring layers 112a, 112b, 112c, and 112d formed in different layers, thereby forming an electrical path in the frame 110. The wiring via layers 113a, 113b and 113c may also be formed using a metal material such as copper (Cu), aluminum (Al), silver (Ag), tin (Sn), gold (Au), nickel (Ni), lead (Pb), titanium (Ti), or alloys thereof. The wiring via layers 113a, 113b, and 113c may be filled type layers fully filled with a metal material. The first wiring via layer 113a may have a cylindrical sectional shape or an hourglass shape, and the second and third wiring via layers 113b and 113c may have a tapered shape. In this case, the wiring vias of the second and third wiring via layers 113b and 113c may be tapered in opposite directions with respect to each other, based on the first insulating layer 111a.

The stopper layer 112aM may be provided as a plurality of metal layers 112aM1 and 112aM2, including a metal material such as copper (Cu), aluminum (Al), silver (Ag), tin (Sn), gold (Au), nickel (Ni), lead (Pb), titanium (Ti) or alloys thereof. If necessary, an insulating material having a smaller etching rate for the sandblasting than a metal may be used, for example, dry film photoresist may be used. For example, in the case in which the stopper layer 112aM is provided as a plurality of metal layers 112aM1 and 112aM2 including a metal material, a portion, a first metal layer 112aM1, may be formed together when the first wiring layer 112a of the frame 110 is formed, which may be advantages in terms of a process. In addition, the non-active surface of the semiconductor chip 120 may be covered with a metal material, which may be more advantageous for electromagnetic wave shielding and heat dissipation. Further, the stopper layer 112aM may be used as a ground, and in this case, may be electrically connected to a ground pattern of at least one of the wiring layers 112a, 112b, 112c and 112d, to be used as a ground.

The stopper layer 112aM may include a plurality of metal layers 112aM1 and 112aM2 that are distinguished from each other. In detail, the stopper layer 112aM may include a first metal layer 112aM1 embedded in the second insulating layer 111b in such a manner that an upper surface thereof is exposed from an upper surface of the second insulating layer 111b, and a second metal layer 112aM2 having an edge portion embedded in the first insulating layer 111a, while covering the exposed upper surface of the first metal layer 112aM1. For example, the first metal layer 112aM1, which is a first region of the stopper layer 112aM, may be disposed on a lower surface of the first insulating layer 111a and may be covered with the second insulating layer 111b. The second metal layer 112aM2, a second region of the stopper layer 112aM, may be disposed on the upper surface of the second insulating layer 111b such that an edge portion thereof may be covered with the first insulating layer 111a. The first metal layer 112aM1 may be disposed at the same level as the first wiring layer 112a. The second metal layer 112aM2 may be disposed at a level between the first wiring layer 112a and the second wiring layer 112b. In this case, the fact that the first and second metal layers 112aM1 and 112aM2 are distinguished from each other means that they are formed through separate processes. For example, when the first and second metal layers 112aM1 and 112aM2 include the same material, a boundary between the first and second metal layers 112aM1 and 112aM2 may be unclear in some cases, but an example thereof is not limited thereto, and the boundary may be clear.

The edge portion of the second metal layer 112aM2 which is the second region of the stopper layer 112aM may have a step (h) with respect to a portion of the second metal layer 112aM2, the second region of the stopper layer 112aM, exposed by the recess portion 110H. In detail, a thickness of the edge portion covered with the first insulating layer 111a of the stopper layer 112aM may be greater than the thickness of the portion exposed by the recess portion 110H, which is because a portion of the exposed region may be partially removed in the process of sand blasting or the like.

Although not illustrated in the drawing, at least one wiring via in the second wiring via layer 113b may be connected to the stopper layer 112aM, and may be connected to the power and/or ground pattern of the third wiring layer 112c. For example, the power and/or ground pattern of the stopper layer 112aM and the third wiring layer 112c may be connected. In this case, the stopper layer 112aM may be a metal layer 112aM1, 112aM2 including a metal material, and thus, may function as a power and/or ground pattern. Thus, heat emitted through the inactive surface of the semiconductor chip 120 may be easily discharged to the lower portion of the fan-out semiconductor package 100.

The semiconductor chip 120 may be an integrated circuit (IC) in which hundreds to millions or more of devices are integrated in a single chip. The semiconductor chip 120 may be a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, or the like, in detail, may be an application processor (AP), but an example thereof is not limited thereto. In addition, the semiconductor chip 120 may be a memory such as a volatile memory (for example, a dynamic random access memory (DRAM)), a non-volatile memory (for example, a read only memory (ROM)), a flash memory, or the like, or may be a logic such as an analog-to-digital (ADC) converter, an application-specific integrated circuit (ASIC), or the like.

The semiconductor chip 120 may be formed based on an active wafer. A base material forming a body thereof, silicon (Si), germanium (Ge), gallium arsenide (GaAs) or the like may be used. The body may include various circuits formed therein. The connection pad 120P disposed on the active surface of the body is provided to electrically connect the semiconductor chip 120 to other components. The connection pad 120P may be formed using a metal material such as aluminum (Al), copper (Cu) or the like without particular limit. A passivation film (not illustrated) such as an oxide film or a nitride film that exposes the connection pad 120P may be formed on the active surface of the body, and the passivation film (not illustrated) may be a double layer of an oxide film and a nitride film. The passivation film (not illustrated) may have an opening (not illustrated) exposing at least a portion of the connection pad 120P. An insulating film (not illustrated) or the like may be further disposed in a required position. The semiconductor chip 120 may be a bare die or may also be a packaged die in which an insulating layer (not illustrated), a redistribution layer (not illustrated), a bump (not illustrated) and the like are formed on the active surface.

A first connection member 120A may be introduced to electrically connect the connection pad 120P of the semiconductor chip 120 to the redistribution layer 142 of the connection structure 140. The first connection member 120A may be a metal post or a metal pillar, such as a copper post or a copper post, but an example thereof is not limited thereto. By introducing the first connection member 120A, the connection pad 120P may be electrically connected to the redistribution layer 142 of the connection structure 140 easily, regardless of the thickness of the semiconductor chip 120. The first connection member 120A may have a substantially vertical side surface. The number of the first connection members 120A is not particularly limited, and may be variously applied depending on the number of the connection pads 120P. The first connection member 120A is electrically connected to the redistribution layer 142 through a first connection via 143A of a connection via 143 of the connection structure 140, and may physically contact the first connection via 143A.

A second connection member 120B may be introduced to electrically connect the uppermost wiring layer 112d of the frame 110 to the redistribution layer 142 of the connection structure 140. The second connection member 120B may also be a metal post, such as a copper post, but an example thereof is not limited thereto. By introducing the second connection member 120B, a problem such as a copper burr, which may occur while the surface of the fourth wiring layer 112d, an uppermost wiring layer, is processed in a grinding process, may be reduced. The second connection member 120B may also have a substantially vertical side. The number of the second connection members 120B is not particularly limited, and may be variously applied according to the design of the pattern of the uppermost wiring layer 112d. The second connection member 120B is electrically connected to the redistribution layer 142 through a second connection via 143B of the connection via 143 of the connection structure 140 and may physically contact the second connection via 143B.

The encapsulant 130 covers at least a portion of each of the frame 110, the semiconductor chip 120, and the first and second connection members 120A and 120B, and fills at least a portion of the recess portion 110H. The material of the encapsulant 130 is not particularly limited. For example, an insulating material may be used. As the insulating material, a thermosetting resin such as an epoxy resin, a thermoplastic resin such as polyimide, or a mixture of these resins with an inorganic filler, or a resin impregnated with a core material such as a glass fiber or the like together with an inorganic filler, for example, a prepreg resin, Ajinomoto Bulid-up Film (ABF) resin, FR-4 resin, Bismaleimide Triazine (BT) resin, or the like, may be used. If necessary, a photoimageable dielectric material, for example, a Photo Imageable Encapsulant (PIE) may be used.

The encapsulant 130 is provided, in which the first and second connection members 120A and 120B are embedded in such a manner that an upper surface of each of the first and second connection members 120A and 120B is exposed from an upper surface of the encapsulant 130 contacting the connection structure 140. In this case, the upper surface of each of the first and second connection members 120A and 120B may be disposed substantially on the same plane as the upper surface of the encapsulant 130, to be coplanar with each other, which is because the first and second connection members 120A and 120B and the encapsulant 130 are simultaneously subjected to grinding processing. In this case, the coplanar is a concept including not only being present on exactly the same plane but also present on approximately the same plane. In this case, a flat surface is provided in the manufacturing process of the connection structure 140, such that a micro-design of the connection structure 140 may be relatively easier.

The connection structure 140 may redistribute the connection pads 120P of the semiconductor chip 120, and may electrically connect the wiring layers 112a, 112b, 112c and 112d of the frame 110 to the connection pads 120P of the semiconductor chip 120. Tens to millions of connection pads 120P having various functions may be redistributed through the connection structure 140, and may be physically and/or electrically connected externally through an electrical connection metal 170 according to functions thereof.

The connection structure 140 includes an insulating layer 141 disposed on the coplanar surface described above, the redistribution layer 142 disposed on the insulating layer 141, and the connection via 143 including first and second connection vias 143A and 143B electrically connecting the redistribution layer 142 to the first and second connection members 120A and 120B while penetrating through the insulating layer 141. The insulating layer 141, the redistribution layer 142, and the connection via 143 as illustrated in the drawings may be composed of a relatively larger number of layers or may be composed of a relatively smaller number of layers, if necessary.

As the material of the insulating layer 141, an insulating material may be used. In addition to the insulating material as described above, a photoimageable dielectric material such as a Photo Imageable Dielectric (PID) resin may be used as the insulating material. For example, the insulating layer 141 may be a photoimageable dielectric layer. In the case in which the insulating layer 141 has photoimageable properties, the insulating layer 141 may be formed to have a further reduced thickness, and a fine pitch of the connection via 143 may be more easily obtained. The insulating layer 141 may be a photoimageable dielectric layer containing an insulating resin and an inorganic filler. When the insulating layer 141 has multiple layers, materials thereof may be the same as each other, and may be different from each other as needed. When the insulating layer 141 is multiple layers, the multiple layers may be integrated according to a process, and boundaries therebetween may be unclear.

The redistribution layer 142 may serve to redistribute the connection pads 120P. As a material of the redistribution layer 142, a metal material such as copper (Cu), aluminum (Al), silver (Ag), tin (Sn), gold (Au), nickel (Ni), lead (Pb), titanium (Ti), or alloys thereof may be used. The redistribution layer 142 may perform various functions according to the design of a relevant layer. For example, the redistribution layer 142 may include a ground (GrouND: GND) pattern, a power (PoWeR: PWR) pattern, a signal (Signal: S) pattern, and the like. The ground (GND) pattern and the power (PWR) pattern may be formed in the same pattern, but an example thereof is not limited thereto. The signal S pattern includes various signals except the ground (GND) pattern, the power (PWR) pattern and the like, for example, may include a data signal and the like, and in addition, may include various pad patterns.

The connection via 143 electrically connects the redistribution layer 142, the first and second connection members 120A and 120B, and the like, formed on different layers, thereby forming an electrical path in the fan-out semiconductor package 100. The connection via 143 may function as a signal via, a ground via, a power via, and the like. The connection via 143 may be formed using a metal material such as copper (Cu), aluminum (Al), silver (Ag), tin (Sn), gold (Au), nickel (Ni), lead (Pb), titanium (Ti), or alloys thereof. The connection via 143 may be a filled type via filled with a metal material, or may be a conformal type via formed as a metal material is formed a wall of a via hole, and further, may have a tapered cross-sectional shape or the like.

A first passivation layer 151 may be an additional configuration to protect the connection structure 140 from external physical chemical damage or the like. The first passivation layer 151 may have an opening 151h that exposes at least a portion of an uppermost redistribution layer 142c of the connection structure 140. The opening 151h may be formed in tens to tens of thousands in the first passivation layer 151. The material of the first passivation layer 151 is not particularly limited. For example, an insulating material may be used. As the insulating material, a thermosetting resin such as an epoxy resin, a thermoplastic resin such as polyimide, or a mixture of these resins with an inorganic filler, or a resin impregnated with a core material such as a glass fiber or the like together with an inorganic filler, for example, a prepreg resin, Ajinomoto Bulid-up Film (ABF) resin, FR-4 resin, Bismaleimide Triazine (BT) resin, or the like, may be used. A known solder resist may also be used.

A second passivation layer 152 may also be an additional configuration to protect the frame 110 from external physical chemical damage or the like. The second passivation layer 152 may have an opening 152h that exposes at least a portion of the third wiring layer 112c which is a lowermost wiring layer of the frame 110. The opening 152h may be formed in tens to tens of thousands in the second passivation layer 152. A material of the second passivation layer 152 is not particularly limited. For example, an insulating material may be used. As the insulating material, a thermosetting resin such as an epoxy resin, a thermoplastic resin such as polyimide, or a mixture of these resins with an inorganic filler, or a resin impregnated with a core material such as a glass fiber or the like together with an inorganic filler, for example, a prepreg resin, Ajinomoto Bulid-up Film (ABF) resin, FR-4 resin, Bismaleimide Triazine (BT) resin, or the like, may be used. A known solder resist may also be used.

An underbump metal layer 160 may also be an additional configuration to improve connection reliability of the electrical connection metal 170, thereby improving board level reliability of the fan-out semiconductor package 100. The underbump metal layer 160 is connected to an uppermost redistribution layer 142 of the connection structure 140 exposed through the opening 151h of the first passivation layer 151. The underbump metal layer 160 may be formed by forming a known metal material, for example, a metal, in the opening 151h of the first passivation layer 151, using a known metallization method such as a plating process.

The electrical connection metal 170 is also an additional configuration to physically and/or electrically connect the fan-out semiconductor package 100 according to an example externally. For example, the fan-out semiconductor package 100 may be mounted on a main board of an electronic device through the electrical connection metal 170. The electrical connection metal 170 may be formed of a low melting point metal, for example, a material including tin (Sn), in more detail, solder or the like, which is merely an example. The material thereof is not particularly limited. The electrical connection metal 170 may be a land, a ball, a pin, or the like. The electrical connection metal 170 may be formed of a multilayer or a single layer. In the case in which the electrical connection metal 170 is formed of multiple layers, a copper pillar and solder may be included therein. In the case of a single layer, a tin-silver solder or copper may be included in the electrical connection metal 170 as an example, and a material thereof is not limited thereto.

The number, spacing, arrangement type and the like of the electrical connecting metal 170 are not particularly limited, and may be sufficiently modified according to the design specifications by those skilled in the art. For example, the number of the electrical connection metals 170 may be in the range of tens to tens of thousands, and may be more or less thereof. For example, when the electrical connection metal 170 is a solder ball, the electrical connection metal 170 may cover a side surface of the underbump metal 160 extending on one surface of the first passivation layer 151, and in this case, connection reliability may be relatively further excellent.

At least one of the electrical connection metals 170 is disposed in a fan-out region. The fan-out region refers to an area outside an area in which the semiconductor chip 120 is disposed. In the case of the fan-out package, reliability is excellent, a large number of I/O terminals may be implemented, and 3D interconnection may be facilitated, as compared with those of a fan-in package. In addition, compared with a ball grid array (BGA) package, a land grid array (LGA) package or the like, a package thickness may be reduced and excellent price competitiveness may be provided in the case of the fan-out package.

Though not illustrated in the drawing, a metal thin film may be further formed on a side wall of the recess portion 110H for heat radiation and/or for shielding electromagnetic waves, as required. Further, if necessary, a plurality of semiconductor chips 120 that perform the same or different functions may also be disposed in the recess portion 110H. If necessary, a separate passive component such as an inductor, a capacitor or the like may be disposed in the recess portion 110H. In addition, a passive component, for example, surface mount (SMT) components including an inductor, a capacitor or the like may also be disposed on the surfaces of the first and second passivation layers 150 and 180, as required.

Figure 11:
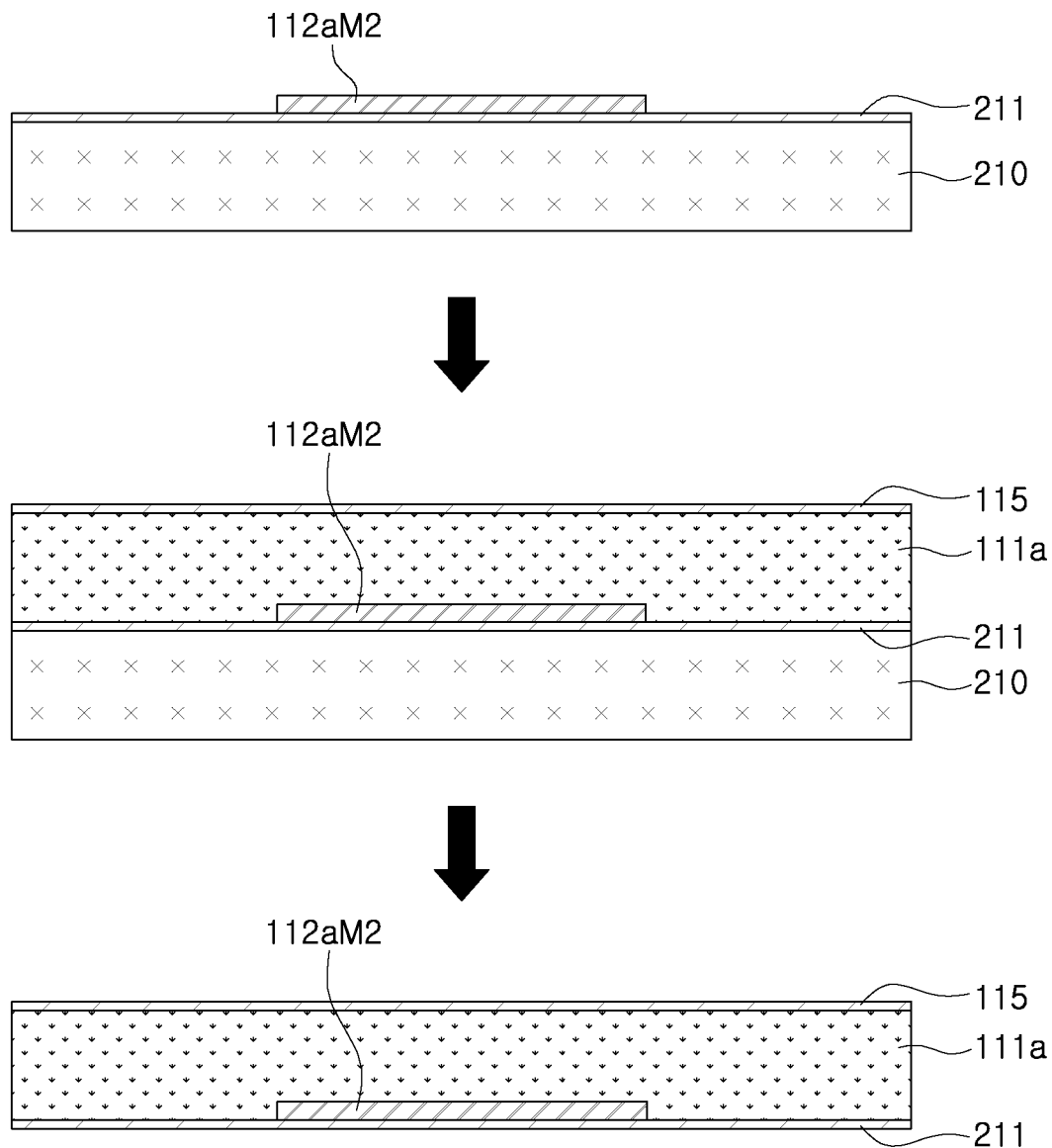
FIGS. 11 and 12 are schematic views illustrating a process of manufacturing a frame of the fan-out semiconductor package of FIG. 9.
Figure 12:
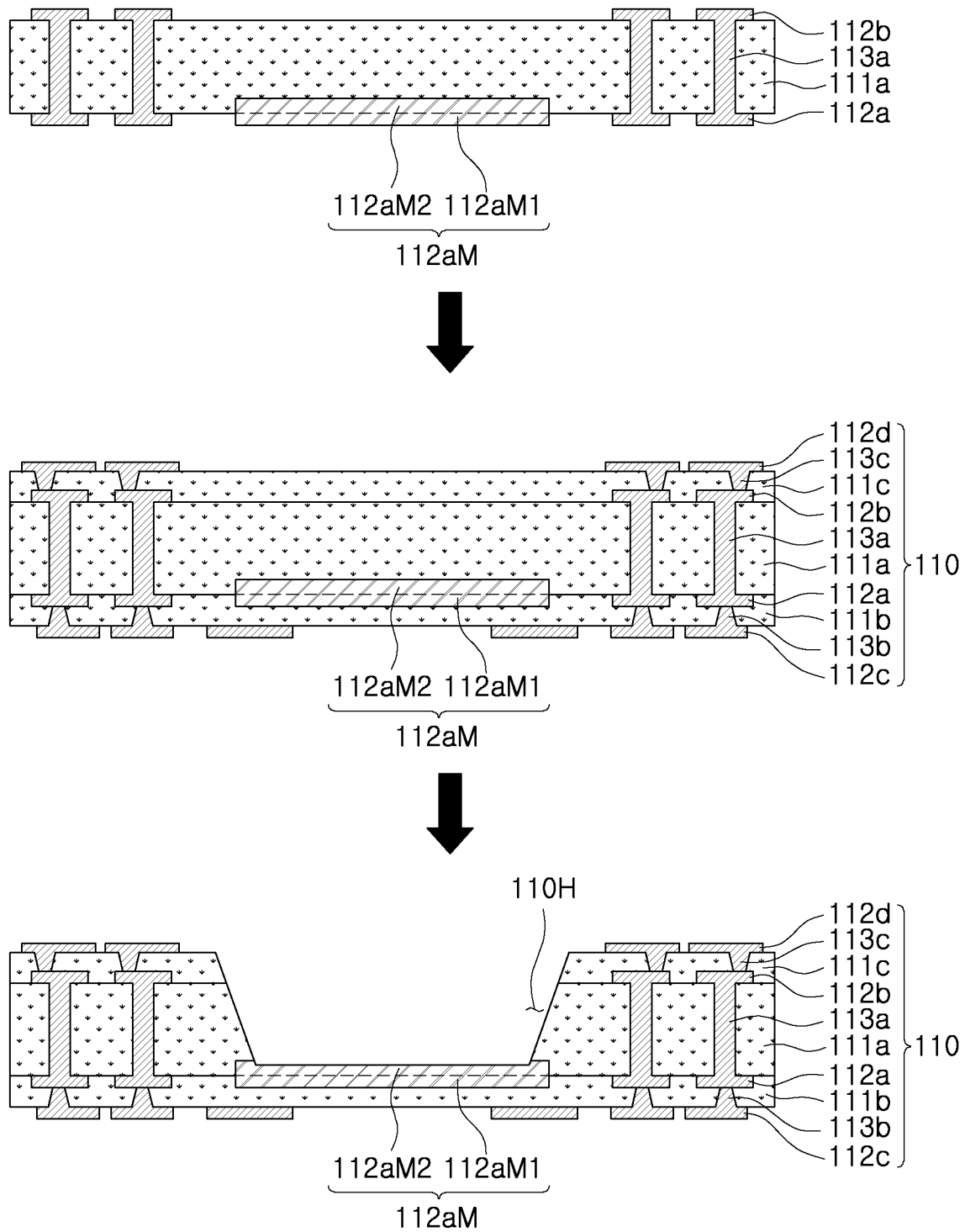

FIGS. 11 and 12 are schematic views illustrating a process of manufacturing a frame of the fan-out semiconductor package of FIG. 9.

Referring to FIG. 11, a carrier 210 having a metal film 211 disposed on at least one surface thereof is first prepared, and a second metal layer 112aM2 is formed on the metal film disposed on one surface of the carrier 210, using a known plating process, such as an additive process (AP), a semi-additive process (SAP), a modified semi-additive process (MSAP), or a tenting process. Next, a first insulating layer 111a having a metal film 115 formed on one surface thereof is laminated on the metal film 211 of the carrier 210 to allow the second metal layer 112aM2 to be embedded therein. As the first insulating layer 111a, a copper clad laminate (CCL) or a prepreg may be used. Next, the carrier 210 is delaminated. The metal film 211 may also be formed on both surfaces of the carrier 210, rather than one surface. In this case, the second metal layer 112aM2 may be respectively formed on the metal films 211 disposed on both surfaces of the carrier 210, and the first insulating layer 111a provided with the metal film 115 thereon may also be formed on both surfaces thereof, and the resultant may be obtained twice after delamination of the carrier 210.

Next, referring to FIG. 12, the first and second wiring layers 112a and 112b, the first wiring via layer 113a, and the first metal layer 112aM1 are formed on both surfaces of the first insulating layer 111a, using the metal films 115 and 211, through known plating processes such as AP, SAP, MSAP, and tenting. As a result, the stopper layer 112aM is formed. A via hole for formation of the first wiring via layer 113a may be formed by laser drilling and/or mechanical drilling. Next, second and third insulating layers 111b and 111c are formed on and under the first insulating layer 111a. The second and third insulating layers 111b and 111c may be formed by a method of laminating and curing a prepreg, ABF, or the like. Next, the third and fourth wiring layers 112c and 112d and the second and third wiring via layers 113b and 113c are formed using a known plating process such as AP, SAP, MSAP, or tenting. Via holes for the second and third wiring via layers 113b and 113c may also be formed using mechanical drilling and/or laser drilling. Next, after attaching a dry film (not illustrated) on an upper side of the frame 110, the recess portion 110H is formed to penetrate through the first insulating layer 111a and the third insulating layer 111c, through sandblasting, laser processing, plasma processing, and then, a dry film (not illustrated) is removed. In this case, the stopper layer 112aM functions as a stopper. Through the series of processes, the frame 110 described above may be manufactured.

As set forth above, a fan-out semiconductor package according to the exemplary embodiments of the present disclosure may make it possible to easily apply a wiring layer to a backside, and to improve productivity and quality during a manufacturing process for a blind recess portion of a frame without affecting an entire thickness of a package or warpage.

The expressions, 'coplanar' or 'on the same level', in the present disclosure is meant to include not only being located at exactly the same level but also located at approximately the same level as a result of a grinding process or the like.

In the present disclosure, the lower side, the lower portion, the lower surface and the like refer to the downward direction with respect to the cross section of the drawings for convenience, and the upper side, the upper portion, and the upper surface are used in the opposite direction. It should be noted, however, that this is a definition of a direction for the sake of convenience of explanation, and the scope of rights of the claims is not particularly limited by description of such direction.

The meaning of being connected in the present disclosure encompasses not only a direct connection, but also includes an indirect connection through an adhesive or the like. In addition, the term "electrically connected" means a concept including both a physical connection and non-connection. Further, the first and second expressions are used to distinguish one component from another component and do not limit the order and/or importance of components and the like. In some cases, without departing from the scope of the rights, a first component may be referred to as a second component, and similarly, a second component may also be referred to as a first component.

The expression, an example, used in this disclosure does not mean the same embodiment, but is provided for emphasizing and explaining different unique features. However, the above-mentioned examples do not exclude being implemented in combination with the features of other examples. For example, although the description in the specific example is not described in another example, it may be understood as an explanation related to another example, unless otherwise described or contradicted by the other example.

The terms used in this disclosure are used only to illustrate an example and are not intended to limit the present disclosure, and the singular expressions include plural expressions unless the context clearly dictates otherwise.

What is claimed is:

1. A fan-out semiconductor package comprising:
  a frame including a plurality of wiring layers electrically connected to each other, and having a recess portion having a bottom surface on which a stopper layer is disposed;
  a semiconductor chip having an active surface on which a connection pad is disposed and an inactive surface opposing the active surface, the inactive surface being disposed in the recess portion to face the stopper layer;
  an encapsulant covering at least a portion of the frame and at least a portion of the semiconductor chip, the encapsulant being disposed in at least a portion of the recess portion; and
  a connection structure disposed on the frame and the active surface of the semiconductor chip, and including a redistribution layer electrically connected to the plurality of wiring layers and the connection pad,
  wherein a thickness of the stopper layer is greater than a thickness of each of the plurality of wiring layers,
  wherein the stopper layer comprises a plurality of metal layers that respectively comprise a metal material, and
  wherein one of the plurality of metal layers is disposed on the same level as one of the plurality of wiring layers.

2. The fan-out semiconductor package of claim 1, wherein at least one of the plurality of wiring layers comprises a ground pattern, and
  the stopper layer is electrically connected to the ground pattern.

3. The fan-out semiconductor package of claim 1, wherein the frame comprises a first insulating layer, a first wiring layer disposed on a lower surface of the first insulating layer, a second wiring layer disposed on an upper surface of the first insulating layer, a second insulating layer disposed on the lower surface of the first insulating layer to cover the first wiring layer, a third insulating layer disposed on the upper surface of the first insulating layer to cover the second wiring layer, a third wiring layer disposed on a lower surface of the second insulating layer, and a fourth wiring layer disposed on an upper surface of the third insulating layer, and the plurality of wiring layers include the first to fourth wiring layers.

4. The fan-out semiconductor package of claim 3, wherein a first region of the stopper layer is disposed on the lower surface of the first insulating layer to be covered by the second insulating layer, and a second region of the stopper layer is disposed on an upper surface of the second insulating layer, in such a manner that an edge thereof is covered by the first insulating layer.

5. The fan-out semiconductor package of claim 4, wherein the edge of the second region of the stopper layer, covered by the first insulating layer, has a step from a portion of the second region of the stopper layer, the step exposed to the recess portion.

6. The fan-out semiconductor package of claim 3, wherein the third wiring layer is disposed on a level lower than the stopper layer, with reference to the inactive surface of the semiconductor chip.

7. The fan-out semiconductor package of claim 1, further comprising:

a first connection member electrically connecting the connection pad to the redistribution layer; and a second connection member electrically connecting the plurality of wiring layers to the redistribution layer, wherein the encapsulant covers side surfaces of each of the first and second connection members.

8. The fan-out semiconductor package of claim 7, wherein a surface of each of the first and second connection members in contact with the connection structure is coplanar with a surface of the encapsulant in contact with the connection structure.

9. The fan-out semiconductor package of claim 8, wherein the connection structure comprises:

an insulating layer disposed on a coplanar surface of the first and second connection members and the encapsulant;

first and second connection vias passing through the insulating layer and in contact with the first and second connection members, respectively; and the redistribution layer disposed on the insulating layer and electrically connected to the first and second connection members by the first and second connection vias, respectively.

10. The fan-out semiconductor package of claim 1, wherein a side wall of the recess portion is inclined with respect to the stopper layer.

11. The fan-out semiconductor package of claim 1, wherein the inactive surface of the semiconductor chip is attached to the stopper layer through an adhesive member.

12. A fan-out semiconductor package comprising:

a frame including a first insulating layer, a first wiring layer disposed on a lower surface of the first insulating layer, a second wiring layer disposed on an upper surface of the first insulating layer, a second insulating layer disposed on the lower surface of the first insulating layer to cover the first wiring layer, a third insulating layer disposed on the upper surface of the first insulating layer to cover the second wiring layer, a third wiring layer disposed on a lower surface of the second insulating layer, and a fourth wiring layer disposed on an upper surface of the third insulating layer, the first to fourth wiring layers being electrically connected to each other, the frame having a recess portion having a bottom surface on which a stopper layer is disposed;

a semiconductor chip having an active surface on which a connection pad is disposed and an inactive surface opposing the active surface, the inactive surface being disposed in the recess portion to face the stopper layer;

an encapsulant covering at least a portion of the frame and at least a portion of the semiconductor chip, the encapsulant being disposed in at least a portion of the recess portion; and a connection structure disposed on the frame and the active surface of the semiconductor chip, and including a redistribution layer electrically connected to the first to fourth wiring layers and the connection pad, wherein the stopper layer includes:

a first metal layer embedded in the second insulating layer and exposed to an upper surface of the second insulating layer; and a second metal layer of which an edge is embedded in the first insulating layer, the second metal layer covering a portion of the first metal layer exposed to the upper surface of the second insulating layer.

13. The fan-out semiconductor package of claim 12, wherein the stopper layer has a thickness greater than a thickness of each of the first to fourth wiring layers.

14. A fan-out semiconductor package comprising:

a frame including a plurality of insulating layers and a plurality of wiring layers respectively disposed on the plurality of insulating layers and electrically connected to each other, the frame having a recess portion having a bottom surface on which a stopper layer is disposed;

a semiconductor chip having an active surface on which a connection pad is disposed and an inactive surface opposing the active surface, the inactive surface being disposed in the recess portion to face the stopper layer;

an encapsulant covering at least a portion of the frame and at least a portion of the semiconductor chip, the encapsulant being disposed in at least a portion of the recess portion; and a connection structure disposed on the frame and the active surface of the semiconductor chip, and including a redistribution layer electrically connected to the plurality of wiring layers and the connection pad, wherein the stopper layer includes a first portion embedded in the plurality of insulating layers, and a remaining portion of the stopper layer is arranged outside the plurality of insulating layers.

15. The fan-out semiconductor package of claim 14, wherein a thickness of the stopper layer is greater than a thickness of each of the plurality of wiring layers.

* * * * *